(12) United States Patent
Tai

(10) Patent No.: US 6,586,321 B2
(45) Date of Patent: *Jul. 1, 2003

(54) METHOD FOR FORMING METAL SILICIDE LAYER

(75) Inventor: Kaori Tai, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/490,277

(22) Filed: Jan. 24, 2000

(65) Prior Publication Data

US 2002/0111018 A1 Aug. 15, 2002

(30) Foreign Application Priority Data

Jun. 29, 1999 (JP) ............................. 11-183152

(51) Int. Cl.$^7$ ................................. H01L 21/28
(52) U.S. Cl. .................. 438/592; 438/586; 438/655; 438/683; 438/976
(58) Field of Search ................. 438/592, 655, 438/682, 976, 683, 649, 533, 584, 588

(56) References Cited

U.S. PATENT DOCUMENTS

| 5,047,367 | A | * | 9/1991 | Wei .............................. 437/200 |
| 5,550,084 | A | * | 8/1996 | Anjum .......................... 437/200 |
| 5,736,461 | A | * | 4/1998 | Berti ............................. 438/651 |
| 5,874,342 | A | * | 2/1999 | Tsai .............................. 438/301 |
| 5,902,129 | A | * | 5/1999 | Yoshikawa .................. 438/592 |
| 6,022,801 | A | * | 2/2000 | Domenicucci et al. ....... 438/653 |
| 6,040,606 | A | * | 3/2000 | Blair ............................ 257/384 |
| 6,103,610 | A | * | 8/2000 | Blair ............................ 438/592 |
| 6,136,705 | A | * | 10/2000 | Blair ............................ 438/682 |
| 6,171,959 | B1 | * | 1/2001 | Nagabushnam ............. 438/683 |
| 6,281,102 | B1 | * | 8/2001 | Cao et al. .................... 438/592 |

OTHER PUBLICATIONS

Tatsuya Yamazaki et al., "21 psec switching 0.1um–CMOS at room temperature using high performance Co salicide process, 1993 IEDM Tech. Dig., p. 906".

* cited by examiner

Primary Examiner—Mary Wilczewski
(74) Attorney, Agent, or Firm—Volentine Francos, PLLC

(57) ABSTRACT

A method of forming a metal silicide layer with low resistance, with minimal consumption of silicon, includes depositing a first metal layer over a silicon-containing region, depositing a second metal layer over the first metal layer, forming an antioxidation layer over the second metal layer, and performing a first heat treatment on the structure to form a metal silicide preliminary layer from the silicon-containing region and the first metal layer and to form an alloy layer including a first metal and a second metal from the second metal layer and the first metal layer. The antioxidation layer and then the alloy layer and a portion of the remaining first metal layer are removed. A second heat treatment on the metal silicide preliminary layer at a higher temperature than the first heat treatment is performed, to change the metal silicide preliminary layer into a metal silicide layer.

27 Claims, 7 Drawing Sheets

METHOD FOR FORMING METAL SILICIDE LAYER

BACKGROUND OF THE INVENTION

1. Field of the Invention

The present invention relates to a method for forming a metal silicide layer, and more particularly to a method for forming a cobalt silicide layer or a titanium silicide layer.

2. Description of Related Art

Semiconductor devices have been becoming smaller and smaller in recent years, and this has been accompanied by increases in gate metallization resistance, and in parasitic resistance or contact resistance of the source and drain portions of transistors. Consequently, it has been very difficult to realize the higher speeds that would be anticipated from the scaling rule. A silicide technique, in which a silicide film of a high-melting-point metal is formed in self-aligning fashion over gate and diffusion layer regions, has come to the forefront as a way to solve this problem. This silicide technique affords a decrease in sheet resistance. The use of titanium silicide ($TiSi_2$) or cobalt silicide ($CoSi_2$) is especially promising from the standpoints of lowering the resistance and achieving thermal stability.

When $TiSi_2$ is used in a fine device having fine wiring on the order of 0.1 $\mu$m, however, it is necessary during the step of forming the $TiSi_2$ to effect a phase transformation from high resistance C49 phase $TiSi_2$ (hereinafter referred to as C49-$TiSi_2$) to low resistance C54 phase $TiSi_2$ (hereinafter referred to as C54-$TiSi_2$). With finely patterned C49-$TiSi_2$, however, this phase transformation is restricted, which creates a problem called the narrow line effect, in which it is difficult to lower the resistance. If an attempt is made to make the wiring even finer (to less than 0.1 $\mu$m), there is a sharp increase in the sheet resistance of $TiSi_2$. This is attributable to the aggregation of the $TiSi_2$ and the resulting disconnection of the silicide layer.

In contrast, the narrow line effect is not encountered when $CoSi_2$ is used. Also, in the formation of the $CoSi_2$, a cap film made from titanium nitride (TiN) or titanium (Ti) is provided over the top layer of cobalt (Co) provided over the silicon (Si). This allows the oxidation of the surface of the cobalt layer to be suppressed. According to published literature (1993 IEDM Tech. Dig., p. 906), it is possible to lower the resistance of a narrow line pattern of 0.075 $\mu$M $CoSi_2$, for example.

Let us at this point refer to FIGS. 7A–7D to give a brief description of a common method for using a suicide technique to form a low-resistance $CoSi_2$ layer over a polysilicon gate electrode and a diffusion layer. FIGS. 7A–7D are simplified process diagrams of a conventional low-resistance $CoSi_2$ layer, and illustrates the steps with cross sections of the structure during formation.

First, a polysilicon gate electrode 102 and diffusion layers 104 that flank this gate electrode 102 on both sides are formed on a silicon substrate 100 by an ordinary method. Isolation regions 106 are on the outsides of the diffusion layers 104, formed from thick oxide films. Side wall oxide films 108 are formed on the side walls of the gate electrode 102. Next, a cobalt film 110 is formed by sputtering over the entire main surface of the substrate 100 on which the gate electrode 102 and the diffusion layers 104 have been formed (FIG. 7(A)). After this, an RTA (Rapid Thermal Annealing) treatment ("first RTA treatment") is performed at a temperature of 450 to 650° C. The result of this is that the surface of the gate electrode 102 reacts with the portion of the cobalt film 110 in contact with this surface, forming a first CoSi layer 112 (a layer made up of CoSi, $CoSi_2$, and a compound of CoSi and $CoSi_2$). The surface of the diffusion layers 104 also reacts with the portion of the cobalt film 110 in contact with this surface, forming a second CoSi layer 114 (a layer made up of CoSi, $CoSi_2$, and a compound of CoSi and $CoSi_2$) (FIG. 7(B)) After this, a sulfuric acid peraqueous solution, a hydrochloric acid peraqueous solution, or the like is used to selectively remove a portion of the unreacted cobalt film 110 (FIG. 7(C)). A second RTA treatment is then performed at a temperature of 750 to 900° C., which changes the first CoSi layer 112 and the second CoSi layer 114 into first and second $CoSi_2$ layers 116 and 118 (layers made up almost entirely of $CoSi_2$). Thus, a low-resistance first $CoSi_2$ layer 116 and second $CoSi_2$ layer 118 can be formed on the surface of the gate electrode 102 and on the diffusion layers 104 (FIG. 7(D)).

However, the junction depth of a device tends to be shallow as the device becomes more highly integrated. Accordingly, if too much silicon is consumed in the step in which the silicon on the surface of the diffusion layers 104 reacts with the cobalt film 110 to form a CoSi layer, there is the danger that this junction will be broken and leakage current will be generated. It is therefore necessary to reduce the amount of silicon consumption.

One way to reduce the amount of silicon consumption is to form a thinner cobalt film. However, when a cobalt film with a thickness of 10 nm, for example, is formed by sputtering as in the past, the sputtering only lasts about 13 seconds. Therefore, if an attempt is made to make the film even thinner, the film formation time will be shorter still, making it difficult to control the film thickness.

SUMMARY OF THE INVENTION

It is an object of the present invention to provide a method with which a metal silicide layer with low resistance can be easily formed on a substrate, with minimal consumption of silicon.

In order to achieve this object, the method of the present invention for forming a metal silicide layer comprises the following steps in the formation of a metal silicide layer over a silicon-containing region.

(1-1) A step of forming a first metal layer by depositing a first metal over the silicon-containing region.

(1-2) A step of forming a second metal layer by depositing a second metal over the first metal layer.

(1-3) A step of forming an antioxidation layer over the second metal layer.

(2) A step of performing a first heat treatment on the structure comprising the silicon-containing region, the first metal layer, the second metal layer, and the antioxidation layer (those formed by deposition in steps (1-1) to (1-3)), thereby:

(a) forming a metal silicide preliminary layer from a region on the first metal layer side of the silicon-containing region and a region on the silicon-containing region side of the first metal layer, and (b) forming an alloy layer including a first metal and a second metal from the second metal layer and a region on the second metal layer side of the first metal layer.

(3) A step of removing the antioxidation layer and then removing the alloy layer and a portion of the remaining first metal layer.

(4) A step of performing a second heat treatment on the metal silicide preliminary layer (the layer formed in step (2)) at a higher temperature than in the first heat treatment so as to change the metal silicide preliminary layer into a metal silicide layer.

With the present invention, the above-mentioned step (2), in which the first heat treatment is performed, involves forming an alloy layer including a first metal and a second metal from the second metal layer and a region on the second metal layer side of the first metal layer, so the metal silicide preliminary layer formed from the region on the first metal layer side of the silicon-containing region and the region on the silicon-containing region side of the first metal layer can be formed in a thickness of only 35 nm or less. This is because part of the first metal layer is consumed in the formation of the alloy layer, so the region of the first metal layer consumed in the formation of the metal silicide preliminary layer is smaller (narrower) than in the past. The above-mentioned step (4), in which the second heat treatment is performed on this metal silicide preliminary layer, makes it possible for a thin-film metal silicide layer to be formed over the silicon-containing region. As a result, if a metal silicide layer is formed over the surface of the diffusion layer of a semiconductor device using this method, the amount of silicon consumed on the surface of the diffusion layer will be smaller than in the past, so there is no danger of junction breakage even if the diffusion layer has a shallow junction.

When a cobalt silicide layer is formed as the metal silicide layer, it is preferable for the first metal to be cobalt, and for the second metal to be titanium.

Using these metals in the above-mentioned step (1) will yield a structure including a cobalt layer as the first metal layer over the silicon-containing region, a titanium layer as the second metal layer over this cobalt layer, and an antioxidation layer over this titanium layer. In the above-mentioned step (2), a cobalt silicide preliminary layer (CoSi layer) is formed over the silicon-containing region, and an alloy layer whose main components are cobalt and titanium (Co—Ti(Si) alloy layer) can be formed over the cobalt silicide preliminary layer. It is possible that this alloy layer will contain a small amount of silicon. The antioxidation layer is then removed, and the cobalt layer and alloy layer are removed, after which the second heat treatment is performed to change the CoSi layer into a low-resistance $CoSi_2$ layer, forming a thin-film cobalt silicide layer ($CoSi_2$ layer) over the silicon-containing region. Thus, the use of the method of the present invention makes it possible to form a cobalt silicide layer that is a thin film and has low resistance over the surface of a gate electrode or diffusion layer in a fine semiconductor device having fine wiring on the order of 0.1 μm.

When a titanium silicide layer is formed as the metal silicide layer, it is preferable for the first metal to be titanium, and for the second metal to be cobalt.

Using these metals in the above-mentioned step (1) will yield a structure including a titanium layer as the first metal layer over the silicon-containing region, a cobalt layer as the second metal layer over this titanium layer, and an antioxidation layer over this cobalt layer. In the above-mentioned step (2), a titanium silicide preliminary layer ($C49-TiSi_2$ layer) is formed over the silicon-containing region, and a Co—Ti(Si) alloy layer is formed over the titanium silicide preliminary layer. The antioxidation layer is then removed, and the titanium layer and alloy layer are removed, after which the second heat treatment is performed to change the $C49-TiSi_2$ layer into a low-resistance $C54-TiSi_2$ layer, forming a thin-film (thickness of 35 nm or less) titanium silicide layer ($C54-TiSi_2$ layer) over the silicon-containing region.

It is preferable for the antioxidation layer to be a titanium nitride layer or a tungsten layer.

Any semiconductor material able to withstand the temperature of the first heat treatment can be used as the material that makes up the antioxidation layer. Examples include TiN (titanium nitride), Ta (tantalum), TaN (tantalum nitride), Ru (ruthenium), Ni (nickel), Cu (copper), Mo (molybdenum), W (tungsten), and other heat-resistant materials. Of these, it is preferable to use a material that can be easily made into a film by sputtering, that lends itself well to selective etching, and that has for some time been readily available as a semiconductor material. With these aspects in mind, the use of TiN (titanium nitride) or tungsten (W) is preferred.

It is preferable for the first heat treatment to be performed within a temperature range of 450 to 750° C. (not including 750° C.), and for the second heat treatment to be performed within a temperature range of 750 and 900° C.

The reaction between the silicon and the first metal can be conducted selectively by performing the first heat treatment within a temperature range of 450 to 750° C. Also, the high-resistance metal silicide preliminary layer obtained by reaction between the silicon and the first metal can be changed into a low-resistance metal silicide layer by performing the second heat treatment within a temperature range of 750 to 900° C.

Preferably, when the first metal is cobalt and the second metal is titanium, the first heat treatment is performed within a temperature range of 450 to 650° C. When the first metal is titanium and the second metal is cobalt, it is preferable for the first heat treatment to be performed within a temperature range of 600 to 750° C.

In the simultaneous formation of metal silicide layers of different thickness over different silicon-containing regions, it is preferable for the following steps to be included. Here, a first silicon-containing region and a second silicon-containing region are provided as the different silicon-containing regions, and a thick metal silicide layer is provided over the second silicon-containing region.

(1-1) A step of forming first metal layers by depositing a first metal over a first silicon-containing region and a second silicon-containing region.

(1-2) A step of forming a second metal layer by depositing a second metal over the first metal layer.

(1-2#) A step of removing part of the second metal layer located over the second silicon-containing region.

(1-3) A step of forming an antioxidation layer over the remaining second metal layer and over the first metal layer exposed from the second metal layer.

(2) A step of performing a first heat treatment on the structure formed through steps (1-1) to (1-3), thereby:

(a)-1: forming a metal silicide first preliminary layer from a region on the first metal layer side of the first silicon-containing region and a region on the first silicon-containing region side of the first metal layer, (a)-2: forming a metal silicide second preliminary layer that is thicker than the first preliminary layer from a region on the first metal layer side of the second silicon-containing region and a region on the second silicon-containing region side of the first metal layer, and (b) forming an alloy layer including a first metal and a second metal from a region on the second metal layer side of the first metal layer and the remaining second metal layer.

(3) A step of removing the antioxidation layer and then removing the alloy layer and a portion of the remaining first metal layer.

(4) A step of performing a second heat treatment on the first preliminary layer and second preliminary layer at a higher temperature than in the first heat treatment so as to change the first preliminary layer and second preliminary layer into a metal silicide first layer and a metal silicide second layer.

As a result, a first layer of thin-film metal silicide can be formed over the first silicon-containing region, and a second layer of metal silicide that is thicker than the first layer can be simultaneously formed over the second silicon-containing region. This is because the second metal layer was removed from over the second silicon-containing region in step (1-2#), so the alloy layer including the first metal layer and second metal layer was not formed. Because no alloy layer is formed, the first metal layer consumes more of the silicon in the second silicon-containing region, allowing a thicker metal silicide layer to be formed. Thus, the thickness of the metal silicide layer can be varied as required. When this method is employed to form a semiconductor device, a thin film of adequate thickness for the junction not to be broken can be formed over a diffusion layer with a shallow junction, for example. With a gate electrode with which there is no worry about junction breakage, on the other hand, a thicker metal silicide layer can be formed in an effort to further lower the resistance.

Also, with this method for forming a metal silicide, when the metal silicide layer is a cobalt silicide layer, it is preferable for the first metal to be cobalt, and for the second metal to be titanium. When the metal silicide layer is a titanium silicide layer, it is preferable for the first metal to be titanium, and for the second metal to be cobalt.

It is also preferable for the antioxidation layer to be a titanium nitride layer or a tungsten layer.

It is preferable for the first heat treatment to be performed within a temperature range of 450 to 750° C. (not including 750° C.), and for the second heat treatment to be performed within a temperature range of 750 and 900° C.

Also, the antioxidation layer is removed in the above-mentioned method for forming a metal silicide layer, and when a TiN layer, for example, is used as the antioxidation layer, it is preferable to remove it by wet etching using an ammonia peraqueous solution (a mixture of $H_2O$, $NH_4OH$, and $H_2O_2$). Doing so allows the TiN layer to be selectively removed.

Also, the alloy layer and a portion of the remaining unreacted first metal layer are removed after the antioxidation layer has been removed, and when cobalt is used as the first metal, both the first metal layer and the alloy layer can be removed by wet etching using a sulfuric acid peraqueous solution (a mixture of $H_2SO_4$ and $H_2O_2$) or a hydrochloric acid peraqueous solution (a mixture of $H_2O$, HCl, and $H_2O_2$). When titanium is used as the first metal, it is preferable for the alloy layer to be removed with a sulfuric acid peraqueous solution or a hydrochloric acid peraqueous solution, and for the first metal layer to be removed with an ammonia peraqueous solution.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1A:
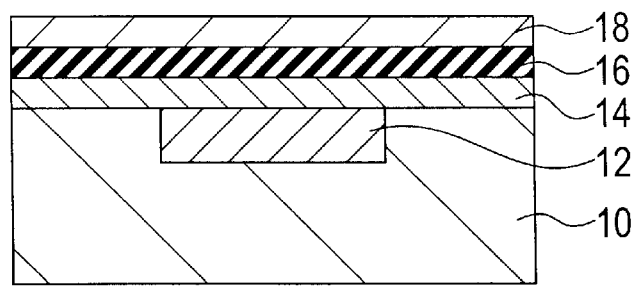
FIGS. 1(A) to 1(C) are process diagrams illustrating an embodiment of the present invention.
Figure 1B:
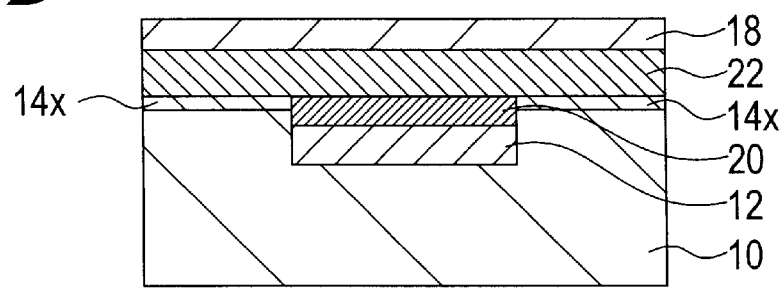
Figure 1C:
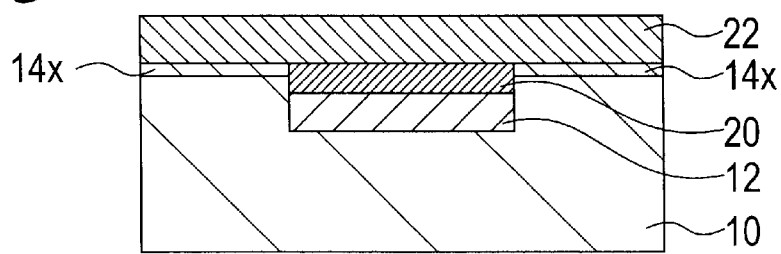
Figure 2A:
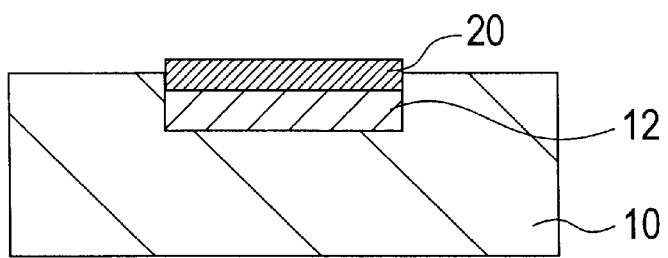
FIGS. 2(A) and 2(B) are process diagrams illustrating an embodiment of the present invention, and are a continuation of FIG. 1.
Figure 2B:
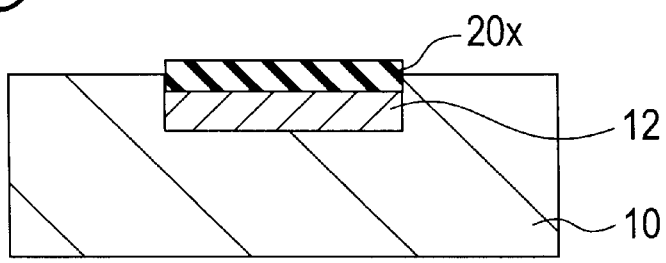
Figure 3A:
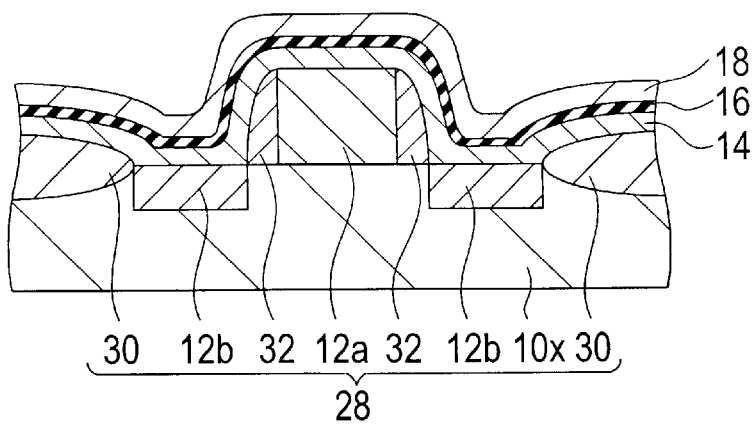
FIGS. 3(A) to 3(D) are simplified process diagrams illustrating a first example.
Figure 3B:
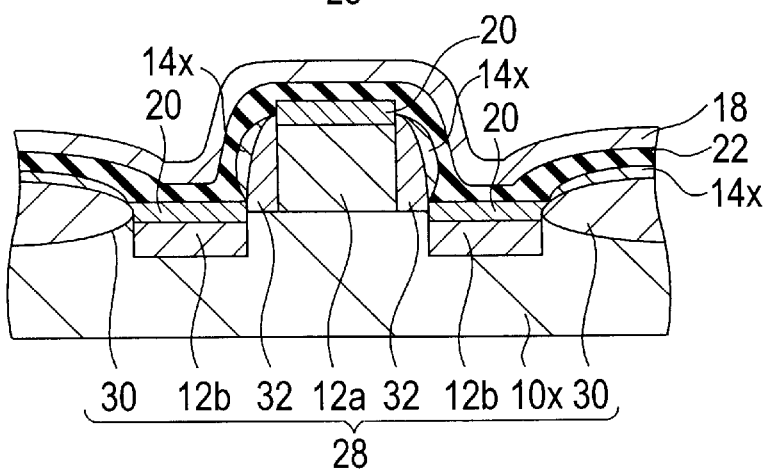
Figure 3C:
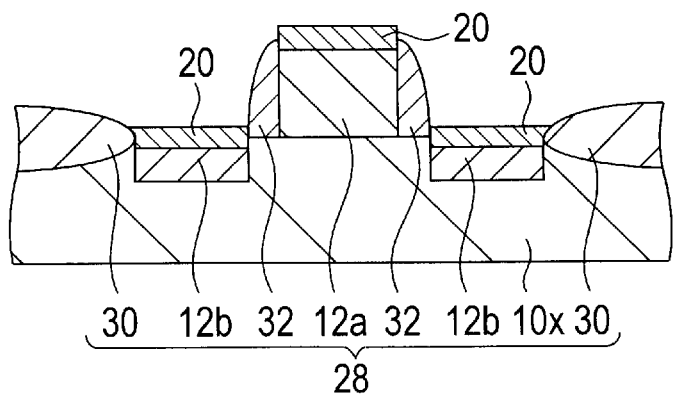
Figure 3D:
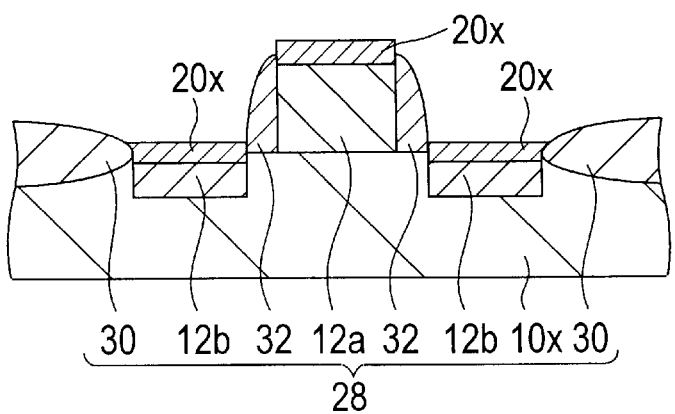

Embodiments of the present invention will now be described with reference to the figures. These figures are merely schematic illustrations of the shape, size, and arrangement relationships of the various components, and are intended to facilitate an understanding of the present invention, and therefore do not limit the present invention to the illustrated examples. In the figures, some of the hatching indicating cross sectional surfaces has been eliminated to make the figures easier to understand.

FIGS. 1A–1C and 2A–2B are simplified process diagrams illustrating an embodiment of the present invention. These figures are cross sections of the structure during formation.

The structure used in this embodiment has a silicon-containing region 12 formed as an island within an insulation region 10 such as an isolation region provided to a substrate (in this embodiment, the insulation region is encompassed by the term "substrate").

First of all, in this invention, a first metal is deposited on the silicon-containing region 12 of the substrate 10 to form a first metal layer 14 with a thickness of 5 to 20 nm. A second metal is then deposited over the first metal layer 14 to form a second metal layer 16 with a thickness of 5 to 50 nm. After this, an antioxidation layer 18 is formed in a thickness of 10 to 100 nm over the second metal layer 16 (FIG. 1(A)). These layers 14, 16, and 18 are formed by sputtering, for instance. The antioxidation layer 18 is a layer provided in a subsequent first heat treatment step in order to prevent the oxidation of the first metal layer and second metal layer. For example, when this structure is utilized as a semiconductor device, a problem of increased sheet resistance will be encountered if the first and second metal layers are oxidized.

Next, a first heat treatment is performed on the structure comprising the silicon-containing region 12, the first metal layer 14, the second metal layer 16, and the antioxidation layer 18. This simultaneously forms a metal silicide preliminary layer 20 and an alloy layer 22. This first heat treatment is performed by RTA, involving heating for 10 to 60 seconds at a temperature between 450 and 750° C. Performing the heat treatment at a temperature within this range allows the reaction between the silicon and the first metal to be conducted selectively. The heat treatment time will vary with the material and thickness of the first metal layer and second metal layer. When, for example, the first metal layer is a cobalt layer and the second metal layer is a titanium layer, it is preferable for the first heat treatment to be carried out at a temperature between 450 and 600° C. It is even better to carry it out by heating for 10 to 30 seconds between 500 and 600° C. The metal silicide preliminary layer 20 is formed from a region on the first metal layer 14 side of the silicon-containing region 12 and a region on the silicon-containing region 12 side of the first metal layer 14. The alloy layer 22 is formed from a region on the second metal layer 16 side of the first metal layer 14 and the second metal layer 16, and the alloy layer 22 includes both the first metal and the second metal. In this step, the alloy layer 22 is formed by the consumption of the first metal in the first metal layer 14, which is used to form a metal silicide preliminary layer, simultaneously with the metal silicide preliminary layer 20. Accordingly, the amount of first metal consumed in the formation of the metal silicide preliminary layer can be reduced, so the metal silicide preliminary layer can be formed thinner. Also, since the antioxidation layer 18 is formed in the structure subjected to this first heat treatment, the first metal and second metal are prevented from being oxidized by the heat treatment (FIG. 1(B)).

The antioxidation layer 18 is then removed. When TiN is used as the material that makes up the antioxidation layer 18, it is preferable to remove the antioxidation layer 18 by wet etching using an ammonia peraqueous solution (FIG. 1(C)).

Next, the alloy layer 22 and the remaining portion 14x of the unreacted first metal layer are removed. The remaining portion 14x of the first metal layer is that portion of the first metal layer 14 deposited in a region other than the silicon-containing region 12, for example. Part of this portion forms the second metal layer 16 and the alloy layer 22 deposited thereon, but the region on the substrate 10 side remains without undergoing a complete reaction. The alloy layer 22 and the remaining portion 14x of the unreacted first metal layer are removed, for example, by wet etching using a sulfuric acid peraqueous solution or a hydrochloric acid peraqueous solution (FIG. 2(A)).

After this, the second heat treatment is performed on the metal silicide preliminary layer 20 at a higher temperature than in the first heat treatment. This changes the high-resistance metal silicide preliminary layer 20 into a low-resistance metal silicide layer 20x. This second heat treatment is preferably performed by RTA for 10 to 60 seconds at a temperature between 750 and 900° C., for example. It is even better to perform RTA for 10 to 30 seconds at a temperature of 800 to 850° C. The temperature and duration of the heat treatment will vary with the thickness of the metal silicide preliminary layer 20.

As a result, the first metal layer 14 is consumed in the first heat treatment of the present invention, forming the alloy layer 22 and the metal silicide preliminary layer 20. Accordingly, the amount of the first metal layer 14 consumed for the formation of the metal silicide preliminary layer is smaller than in the past, and therefore the amount of silicon consumed in the silicon-containing region 12 for the formation of the metal silicide preliminary layer 20 can be smaller. Thus, a thinner metal silicide layer 20x can be formed (FIG. 2(B)).

EXAMPLES

A few examples of the method of the present invention for forming a metal silicide layer will now be given. However, the materials listed for use in the following description, the amounts thereof, the size of the constituent components, the film thickness, the heat treatment temperature and duration, and other such numerical conditions should not be interpreted as anything but examples within the scope of these inventions.

FIRST EXAMPLE

The first example will be described through reference to FIGS. 3A–3D, and is an example in which a low-resistance metal silicide layer is formed over a gate electrode and diffusion layers provided to a substrate in a semiconductor device. FIGS. 3A–3D are simplified process diagrams illustrating the first example, and consist of cross sections, in the gate lengthwise direction, of a semiconductor device in the process of being formed.

First, a polysilicon gate electrode 12a and diffusion layers 12b that flank this gate electrode 12a on both sides are formed in the active region of a silicon substrate 10x by a conventional method. Thick oxide films are provided as isolation regions 30 on the outsides of the diffusion layers 12b. Side wall oxide films 32 are formed on the side walls of the gate electrode 12a. The structure at this point shall be termed the base or underlying layer 28. The gate electrode 12a and the diffusion layers 12b make up the silicon-containing region 12 referred to in the present invention.

Cobalt (Co) is deposited by sputtering as the first metal over the base 28 to form a cobalt film (the first metal layer 14) in a thickness of 10 nm. The cobalt sputtering conditions here include a sputtering power of 700 W, a film formation pressure of 3 mTorr, the use of argon gas, and a film formation temperature of 100° C. Titanium is then deposited by sputtering as the second metal over the cobalt film 14 to form a titanium film (the second metal layer 16) in a thickness of 20 nm. The titanium sputtering conditions here include a sputtering power of 1 kW, a film formation pressure of 3 mTorr, the use of argon gas, and a film formation temperature of 100° C. After this, TiN is deposited by sputtering over the titanium film 16 to form a TiN layer (the antioxidation layer 18) in a thickness of 15 nm. The TiN sputtering conditions here include a sputtering power of 5 kW, a film formation pressure of 7 mTorr, the use of argon gas and $N_2$ gas, and a film formation temperature of 100° C. This procedure yields a structure in which the cobalt film 14, the titanium film 16, and the TiN layer 18 are successively laminated over the base 28 (FIG. 3(A)).

Next, this structure is subjected to a first heat treatment. In this example, an RTA treatment is performed for 30 seconds at a temperature of 550° C. This forms a CoSi layer as the metal silicide preliminary layer 20 in a thickness of 15 nm over the gate electrode 12a and the diffusion layers 12b. The CoSi layer 20 heat treated at this temperature contains a mixture of CoSi and $CoSi_2$. Also, the first heat treatment causes the cobalt film 14 and the titanium film 16 to react, forming a Co—Ti(Si) alloy layer 22 (containing a small amount of silicon) in a thickness of 10 nm (FIG. 3(B)).

After this, the TiN layer 18 is removed. In this example, it is removed by wet etching using an ammonia peraqueous solution. The ammonia peraqueous solution here is a solution in which water ($H_2O$), aqueous ammonia ($NH_4OH$), and hydrogen peroxide ($H_2O_2$) are mixed in a ratio of $H_2O:NH_4OH:H_2O_2=4:1:1$. This allows the TiN layer 18 to be removed selectively, without etching the CoSi layer 20 or the Co—Ti(Si) alloy layer 22.

Next, the alloy layer 22 and the remaining portion 14x of the unreacted first metal layer are removed. In this example, the Co—Ti(Si) alloy layer 22 and the portion 14x of the cobalt film remaining on the isolation regions 30 and the side wall oxide films 32 are removed by wet etching using a sulfuric acid peraqueous solution. The sulfuric acid peraqueous solution used here is, for example, a solution in which sulfuric acid ($H_2SO_4$) and hydrogen peroxide ($H_2O_2$) are mixed in a ratio of $H_2SO_4:H_2O_2=6:1$ (FIG. 3(C)).

After this, the metal silicide preliminary layer 20 is subjected to a second heat treatment at a higher temperature than in the first heat treatment. In this example, RTA is performed for 10 seconds at a temperature of 800° C. This changes the CoSi layer 20 into a low-resistance CoSi$_2$ layer 20x (FIG. 3(D)).

As a result, a CoSi$_2$ layer can be provided as a thin-film (15 nm) metal silicide layer 20x over the gate electrode 12a and the diffusion layers 12b. This means that even when the diffusion layers 12b are formed shallow, there is no danger that the provision of the metal silicide layer will break the junction, allowing the occurrence of leakage current in the semiconductor device that would be caused by such breakage to be suppressed. Furthermore, with this example, the titanium film 16 is formed over the cobalt film 14, and the TiN layer 18 is formed over this titanium film 16. Because the titanium film 16 and the TiN layer 18 serve to inhibit the oxidation of cobalt, the oxidation of the cobalt film 14 in the first heat treatment step can be prevented.

SECOND EXAMPLE

The second example will be described through reference to FIGS. 4A–4D, and is an example in which the present invention is applied to the formation of thin-film local metallization on the substrate of a semiconductor device. FIGS. 4A–4D are simplified process diagrams in which local metallization is formed on a substrate on which a semiconductor element has been formed. In FIGS. 4A–4D, the semiconductor element formation region 40 indicates the diffusion layer portion, and part of this diffusion layer and part of the isolation region 42 formed on the outside of the diffusion layer are shown as partial cross sections. In this example, local metallization is formed that links the top of the diffusion layer with the top of the isolation region.

The differences from the first example will now be described, but the parts that are the same as in the first example will not be described in detail.

First, a silicon film 44 is formed by sputtering in a thickness of 10 to 50 nm over a substrate 10x on which a semiconductor element has been formed. This is followed by photolithography and then etching, which patterns the silicon film 44 such that it remains on the region where the local metallization is to be formed. This forms the base 46 of the second example (FIG. 4(A)).

Figure 4A:
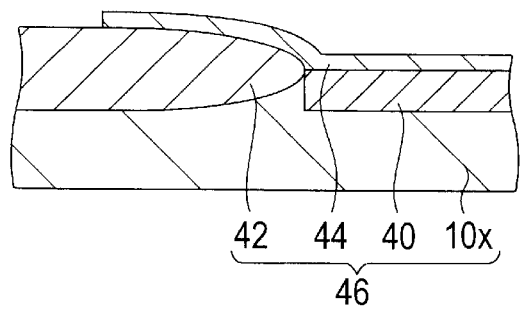
FIGS. 4(A) to 4(D) are simplified process diagrams illustrating a second example.
Figure 4B:
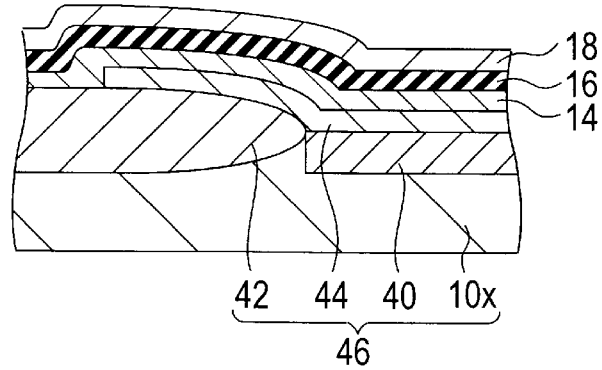
Figure 4C:
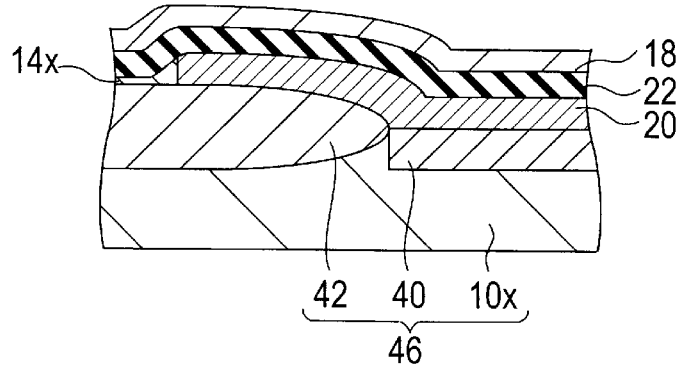
Figure 4D:
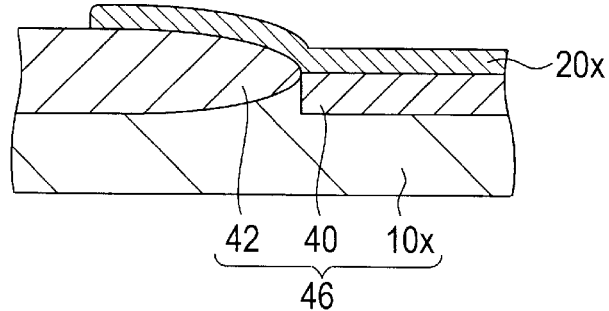

Next, a cobalt film (the first metal layer 14), a titanium film (the second metal layer 16), and a TiN layer (the antioxidation layer 18) are successively formed by sputtering over the base 46 in the same manner as in the first example (FIG. 4(B)).

This structure is then subjected to a first heat treatment in the same manner as in the first example. This causes the pattern 44 of the silicon film to react with the region on the silicon film 44 side of the cobalt film 14, and forms a CoSi layer (a layer containing CoSi and CoSi$_2$) as the metal silicide preliminary layer 20. At the same time, the region on the titanium film 16 side of the cobalt film 14 reacts with the titanium film 16, forming a Co—Ti(Si) alloy layer 22 (FIG. 4(C)).

Then, in the same manner as in the first example, the TiN layer 18 is removed with an ammonia peraqueous solution, after which the Co—Ti(Si) alloy layer 22 and the portion 14x of the unreacted cobalt film remaining on the isolation region 42 are selectively removed using a sulfuric acid peraqueous solution.

The metal silicide preliminary layer 20 is then subjected to a second heat treatment at a higher temperature than in the first heat treatment in the same manner as in the first example. This changes the CoSi layer 20 into a low-resistance CoSi$_2$ layer 20x (FIG. 4(D)).

As a result, the cobalt film 14 and the titanium film 16 react and form the alloy layer 22, so the amount of cobalt film 16 that reacts with the silicon film pattern 44 can be reduced, and this allows for a thinner CoSi layer 20 to be formed by the reaction between the cobalt film 14 and the silicon film pattern 44. Thus, the second example makes it possible to form local metallization composed of a thinner CoSi$_2$ layer than in the past.

THIRD EXAMPLE

The third example will now be described through reference to FIGS. 5A–5D, and relates to the same semiconductor device structure as the first example, but with a thin-film metal silicide layer provided only over the diffusion layer, and a metal silicide layer that is thicker than the metal silicide layer on the diffusion layer provided over the gate electrode. FIGS. 5A–5D are simplified process diagrams of the third example, which illustrate cross sections, in the gate lengthwise direction, of a semiconductor device in the process of being formed.

The differences from the first and second examples will now be described, but the parts that are the same will not be described in detail.

First, just as in the first example, the substrate 10x has a polysilicon gate electrode 12a and diffusion layers 12b as the silicon-containing region 12, isolation regions 30 are provided to the outsides of the diffusion layers 12b, and side wall oxide films 32 are formed on the side walls of the gate electrode 12a. The structure thus formed shall be termed the base 28. In this example, the diffusion layers 12b constitute a first silicon-containing region, and the gate electrode 12a a second silicon-containing region.

Just as in the first example, a cobalt film (the first metal layer 14) and a titanium film (the second metal layer 16) are formed in that order by sputtering over the base 28.

After this, the portion of the second metal layer located over the second silicon-containing region 12a is removed. In this example, the portion of the titanium film on the gate electrode 12a is removed by photolithography followed by etching (FIG. 5(A)).

Next, an antioxidation layer 18 is formed over the remaining second metal layer 16x and over the first metal layer 14y exposed from this second metal layer 16x. In this example, a TiN layer (the antioxidation layer 18) is formed by sputtering over the remaining titanium film 16x and over the portion 14y of the cobalt film exposed from the titanium film 16x (the portion located above the gate electrode 12a).

A first heat treatment is then performed just as in the first example. This causes the region on the cobalt film 14 side of the diffusion layers 12b to react with the region on the diffusion layer 12b side of the cobalt film 14, forming a first CoSi layer in a thickness of 20 nm, for example, as the metal silicide first preliminary layer 20a. Also, the region on the remaining titanium film 16x side of the cobalt film 14 reacts with this remaining titanium film 16x, forming a Co—Ti(Si) alloy layer 22. Also, the region on the cobalt film 14 side of the gate electrode 12a reacts with the region on the gate electrode 12a side of the cobalt film 14, forming a second CoSi layer in a thickness of 40 nm, for example, as the metal silicide second preliminary layer 20b. Since the titanium film has been removed from above the gate electrode 12a, the cobalt film 14 reacts sufficiently with the silicon of the gate electrode 12a. Accordingly, the second CoSi layer 20b is formed thicker than the first CoSi layer 20a (FIG. 5(B)).

Figure 5A:
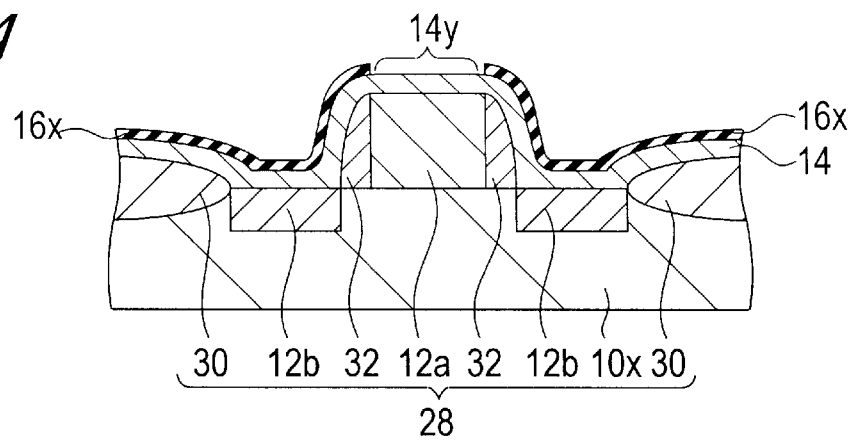
FIGS. 5(A) to 5(D) are simplified process diagrams illustrating a third example.
Figure 5B:
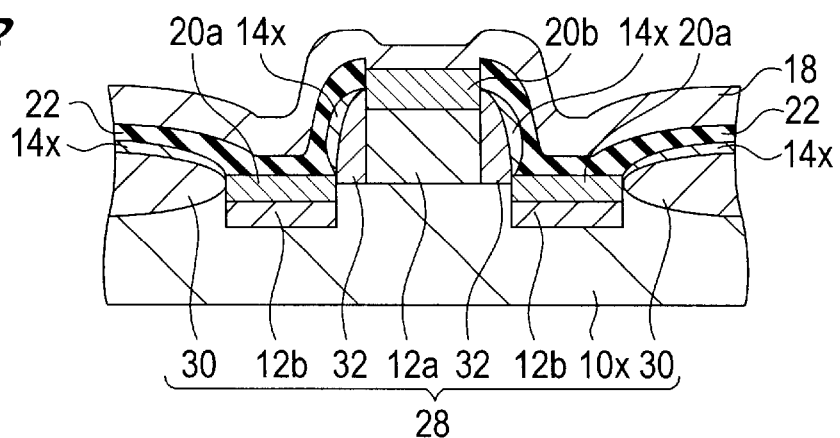
Figure 5C:
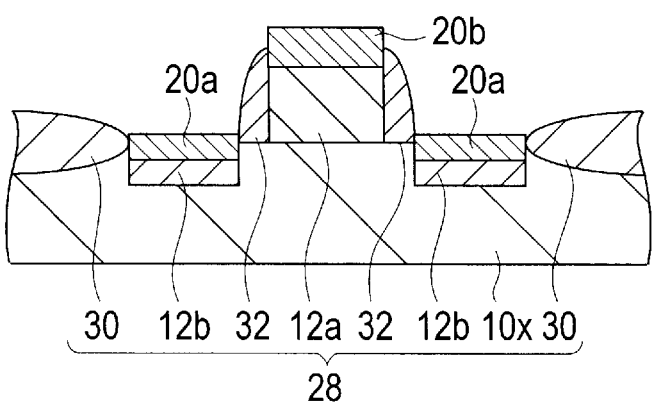
Figure 5D:
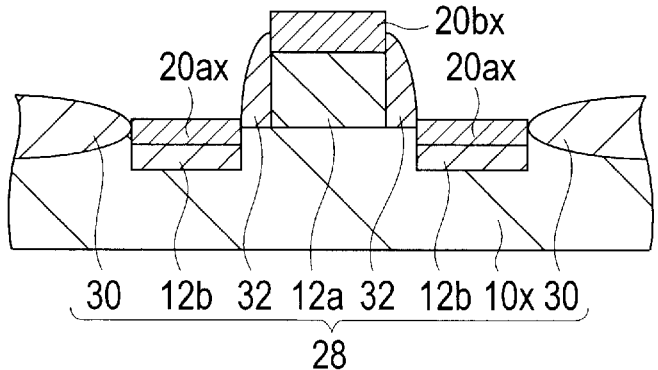
Figure 6A:
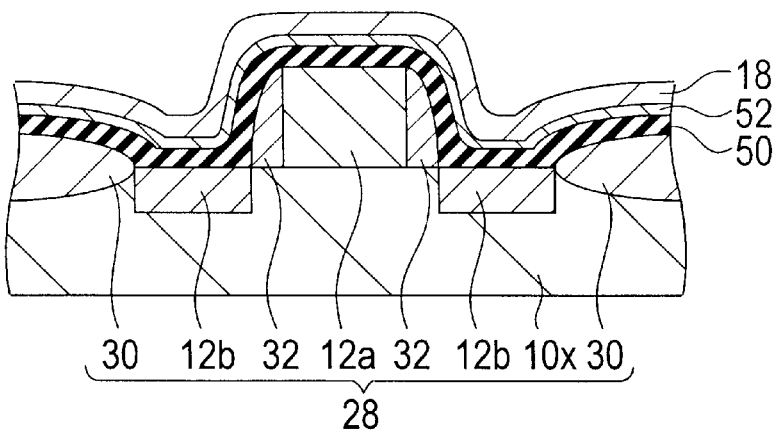
FIGS. 6(A) to 6(D) are simplified process diagrams illustrating a fourth example.
Figure 6B:
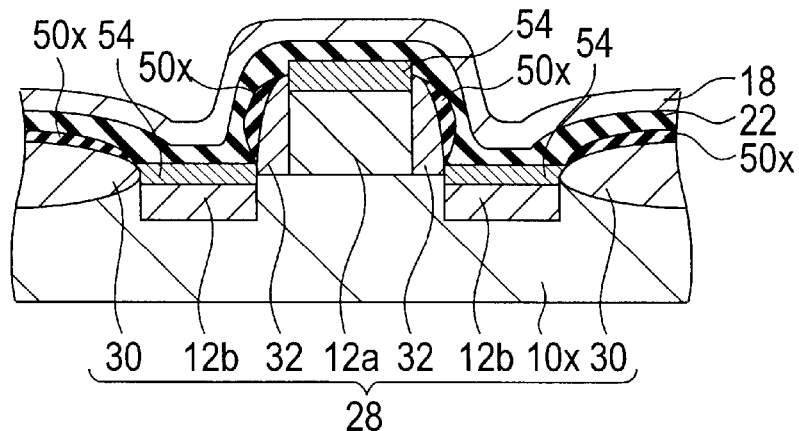
Figure 6C:
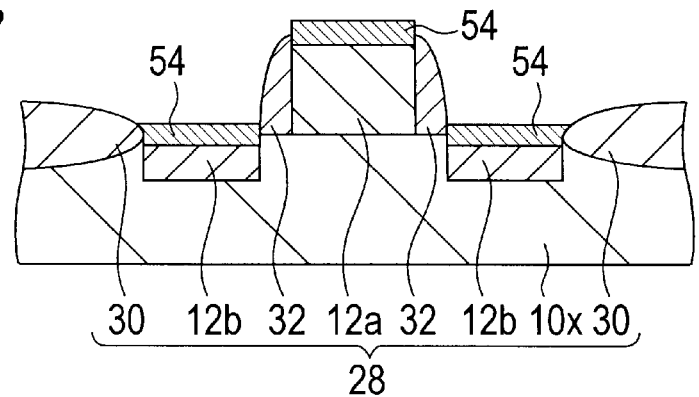
Figure 6D:
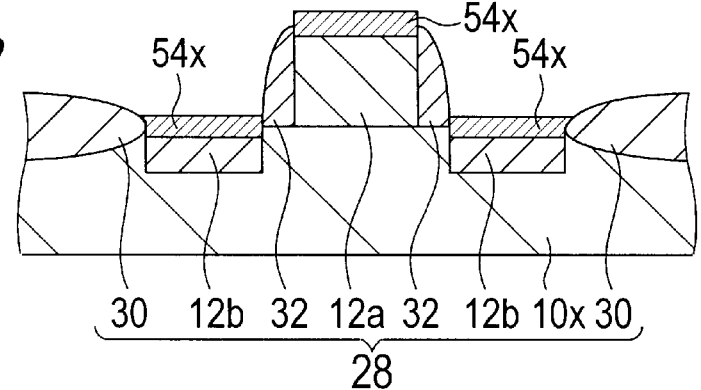
Figure 7A:
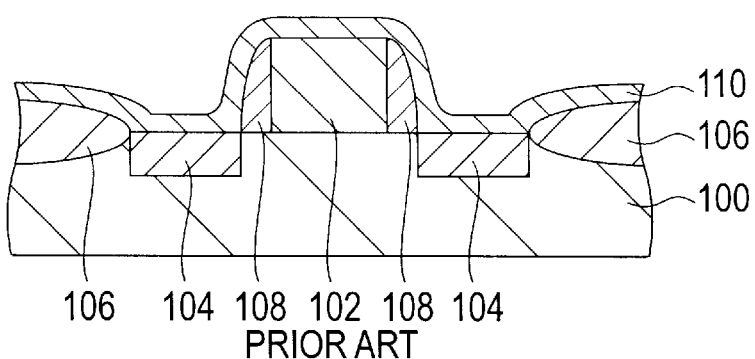
FIGS. 7(A) to 7(D) are simplified process diagrams of a conventional low-resistance $CoSi_2$ layer.
Figure 7B:
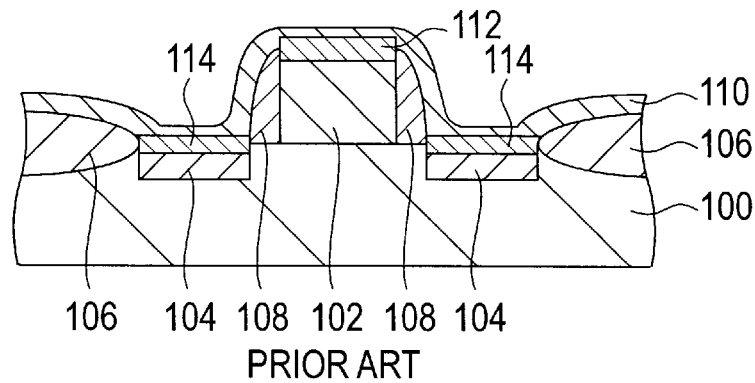
Figure 7C:
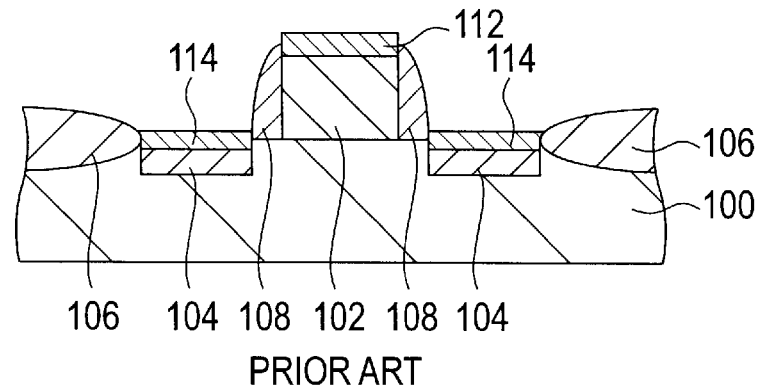
Figure 7D:
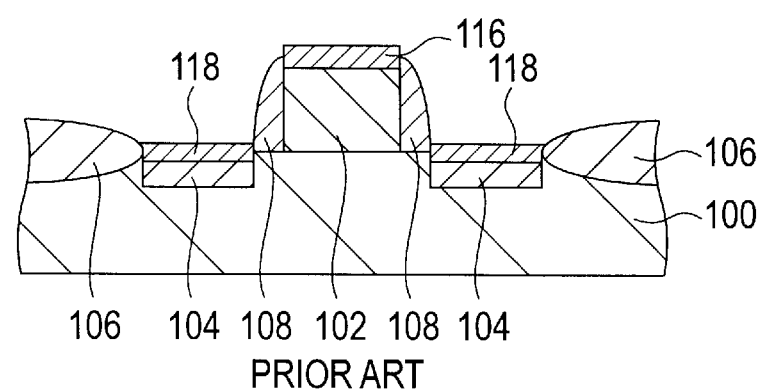

Then, just as in the first example, a TiN layer (the antioxidation layer 18) is removed, after which Co—Ti(Si)

alloy layer 22 and the portion 14x of the remaining cobalt film are removed (FIG. 5(C)).

A second heat treatment at a higher temperature than in the first heat treatment is then performed in the same manner as in the first example. This changes the first CoSi layer 20a and the second CoSi layer 20b into a low-resistance first CoSi$_2$ layer 20ax and second CoSi$_2$ layer 20bx (FIG. 5(D)).

As a result, when there are places in the silicon-containing region where a thin film of a metal silicide layer has to be formed, and places where it need not be a thin film (or places where a thick film is preferable), then metal silicide layers of different thickness can be formed simultaneously. Therefore, in the case of this example, there is no danger that the junction will be broken during formation since the thin-film CoSi$_2$ layer 20ax can be formed over the diffusion layers 12b. Also, the sheet resistance on the gate electrode 12a can be reduced since the thick CoSi$_2$ layer 20bx is formed over the gate electrode 12a.

FOURTH EXAMPLE

The fourth example will now be described through reference to FIGS. 6A–6D, in which a TiSi2 layer is formed as a thin-film metal silicide layer over a silicon-containing region. FIGS. 6A–6D are simplified process diagrams of the fourth example, which illustrate cross sections, in the gate lengthwise direction, of part of a semiconductor device in the process of being formed.

First, a same base or underlying layer 28 is readied in the same manner as in the first example. Titanium is deposited by sputtering as the first metal over this base 28 to form a titanium film (the first metal layer 50) in a thickness of 10 to 50 nm. Cobalt is then deposited by sputtering as the second metal over this titanium film 50 to form a cobalt film (the second metal layer 52) in a thickness of 5 to 30 nm. After this, a TiN layer (the antioxidation layer 18) is formed in a thickness of 10 to 100 nm over this cobalt film 52 (FIG. 6(A)).

A first heat treatment is then performed just as in the first example. In this example, an RTA treatment is performed for 10 to 60 seconds at a temperature of 600 to 750° C. This forms a C49-TiSi$_2$ layer as the metal silicide preliminary layer 54 in a thickness of 20 to 35 nm over the gate electrode 12a and the diffusion layers 12b. The "C49-TiSi$_2$ layer 54" refers to a high-resistance TiSi$_2$ layer of C49 phase. The first heat treatment causes the titanium film 50 to react with the cobalt film 52, forming a Co—Ti(Si) alloy layer 22 in a thickness of 10 to 30 nm (FIG. 6(B)).

After this, the TiN layer (the antioxidation layer 18) is removed by etching with an ammonia peraqueous solution, after which a sulfuric acid peraqueous solution is used to remove the Co-Ti(Si) alloy layer 22. Then, an ammonia peraqueous solution is again used to remove the Co-Ti(Si) alloy layer 22 and the portion 50x of the unreacted titanium film remaining on the isolation regions 30 and the side wall oxide films 32 (FIG. 6(C)).

The C49-TiSi$_2$ layer 54 is then subjected to a second heat treatment. In this example, RTA is performed for 10 to 60 seconds at a temperature of 750 to 900° C. This changes the C49-TiSi$_2$ layer 54 into a low-resistance TiSi$_2$ layer of C54 phase (C54-TiSi$_2$ layer) 54x (FIG. 6(D)).

As a result, a thin-film, low-resistance C54-TiSi$_2$ layer 54x can be formed over the gate electrode 12a and the diffusion layers 12b. In this example, when the TiSi$_2$ layer 54 is formed, the alloy layer 22 of the titanium film 50 and the cobalt film 52 is formed at the same time, so even if the diffusion layers 12b are formed shallow, only a little silicon will be consumed in the formation of the TiSi$_2$ layer 54. Therefore, there is no danger that the junction of the diffusion layers 12b will be broken.

The C54-TiSi$_2$ layer 54x of this example can also be applied to the formation of local metallization as described in the second example. Furthermore, C54-TiSi$_2$ layers of different thickness can be formed simultaneously as in the third example.

The antioxidation layer was formed using TiN in the first to fourth examples given above, but is not limited to this material, and tungsten or another material may be used instead, as long as the material is capable of suppressing the oxidation of the cobalt film and the Co—Ti(Si) alloy layer.

Also, a sulfuric acid peraqueous solution was used for the removal of the alloy layer and the remaining portion of the unreacted first metal layer in the first to fourth examples, but this removal can also be accomplished using other substances. For instance, a hydrochloric acid peraqueous solution may be used. It is preferable for the hydrochloric acid peraqueous solution to be a mixture of water (H$_2$O), hydrochloric acid (HCl), and hydrogen peroxide (H$_2$O$_2$) in a ratio of H$_2$O:HCl:H$_2$O$_2$=5:1:1.

As is clear from the above description, the method of the present invention for forming a metal silicide layer comprises the steps of forming a first metal layer 14 by depositing a first metal over a silicon-containing region 12, forming a second metal layer 16 by depositing a second metal over the first metal layer 14, forming an antioxidation layer 18 over the second metal layer 16, performing a first heat treatment on the structure comprising the silicon-containing region 12, the first metal layer 14, the second metal layer 16, and the antioxidation layer 18, thereby forming a metal silicide preliminary layer 20 from a region on the first metal layer 14 side of the silicon-containing region 12 and a region on the silicon-containing region 12 side of the first metal layer 14, and forming an alloy layer 22 including a first metal and a second metal from the second metal layer 16 and a region on the second metal layer 16 side of the first metal layer 14, removing the antioxidation layer 18 and then removing the alloy layer 22 and a portion of the remaining first metal layer 14x, and performing a second heat treatment on the metal silicide preliminary layer 20 at a higher temperature than in the first heat treatment so as to change the metal silicide preliminary layer 20 into a metal silicide layer 20x.

Accordingly, since an alloy layer 22 including a first metal and a second metal is formed from the second metal layer 16 and a region on the second metal layer 16 side of the first metal layer 14 in the step in which the first heat treatment is performed, the metal silicide preliminary layer 20, which is formed from a region on the first metal layer 14 side of the silicon-containing region 12 and a region on the silicon-containing region 12 side of the first metal layer 14, can be formed in a thickness of only 35 nm or less. This is because part of the first metal layer 14 is consumed in the formation of the alloy layer 22, so the region of the first metal layer 14 consumed in the formation of the metal silicide preliminary layer 20 is smaller (narrower) than in the past. The step in which the second heat treatment is performed on this metal silicide preliminary layer 20 makes it possible for a thin-film, low-resistance metal silicide layer 20x to be formed over the silicon-containing region 12. As a result, if a metal silicide layer is formed over the surface of the diffusion layer of a semiconductor device using this method, the amount of silicon consumed on the surface of the diffusion layer will be smaller than in the past, so there is no danger of junction breakage even if the diffusion layer has a shallow junction.

What is claimed is:

1. A method for forming a metal silicide layer, comprising:

performing a first heat treatment on a laminate of a silicon-containing region, a first metal layer on the silicon-containing region, and a second metal layer on the first metal layer, while said laminate is prevented from being oxidized, thereby forming a first metal silicide preliminary layer in a boundary region between the silicon-containing region and the first metal layer; and performing a second heat treatment at a higher temperature than in said first heat treatment on the first metal suicide preliminary layer, thereby changing the first metal suicide preliminary layer into a first metal suicide, thicknesses of the first metal layer and the second metal layer being selected so that all of the second metal layer finishes reaction simultaneously with or before all of the first metal layer on the silicon-containing region finishes reaction when said first heat treatment is performed, said first heat treatment is performed until all of the first metal layer on the silicon-containing region finishes reaction.

2. A method according to claim 1, wherein the first metal layer has a thickness greater than a thickness of the second metal layer.

3. A method according to claim 1, wherein the first metal silicide preliminary layer is formed while the first metal layer is consumed by alloying the first metal of the first metal layer with the second metal of the second metal layer.

4. A method according to claim 1, wherein the first metal layer is a titanium layer and the second metal layer is a cobalt layer.

5. A method according to claim 1, wherein the first metal layer is a cobalt layer and the second metal layer is a titanium layer.

6. A method for forming a metal silicide layer, comprising:

performing a first heat treatment on a laminate of a silicon-containing region, a titanium layer, and a cobalt layer while said laminate is prevented from being oxidized, thereby forming a titanium silicide preliminary layer in a boundary region between said silicon-containing region and said titanium layer; and performing a second heat treatment at a higher temperature than in said first heat treatment on said titanium silicide preliminary layer, thereby changing said titanium silicide preliminary layer into titanium silicide, said titanium layer having a thickness greater than a thickness of said cobalt layer, thicknesses of said titanium layer and said cobalt layer being selected so that all of said cobalt layer finishes reaction simultaneously with or before all of said titanium layer on said silicon-containing region finishes reaction when said first heat treatment is performed, and said first heat treatment is performed until all of said titanium layer on said silicon-containing region finishes reaction.

7. A method according to claim 6, wherein said titanium silicide preliminary layer is formed while said titanium layer is consumed by alloying titanium of said titanium layer with cobalt of said cobalt layer.

8. A method according to claim 6, wherein said first heat treatment is performed at a temperature of at least 450° C. but lower than 750° C., and said second heat treatment is performed at a temperature of at least 750° C. and no higher than 900° C.

9. A method according to claim 6, wherein said silicon-containing region is provided as a diffusion layer in an active region of a silicon substrate.

10. A method according to claim 6, wherein said silicon-containing region is provided as a gate electrode on an upper side of a top surface of an active region of a silicon substrate.

11. A method according to claim 6, wherein said silicon-containing region is provided as a metallization region on an upper side of a silicon substrate.

12. A method according to claim 6, wherein said silicon-containing region is formed as mutually isolated first and second silicon-containing regions.

13. A method according to claim 12, wherein said first silicon-containing region is provided as a diffusion layer in an active region of a silicon substrate, and said second silicon-containing region is provided as a gate electrode on an upper side of a top surface of the active region of said silicon substrate.

14. A method according to claim 6, wherein aid titanium layer has a thickness in a range of 10–50 nm and said cobalt layer has a thickness in a range of 5–30 nm.

15. A method for simultaneously forming metal silicide layers of different thickness over different silicon-containing regions, comprising:

forming a titanium layer by depositing titanium over a first silicon-containing region and a second silicon-containing region;

forming a cobalt layer by depositing cobalt over said titanium layer;

removing a part of said cobalt layer located over said second silicon-containing region;

forming an antioxidation layer over a remaining portion of said cobalt layer and over said titanium layer exposed from said cobalt layer;

performing a first heat treatment on a structure comprising said first and second silicon-containing regions, said titanium layer, said cobalt layer, and said antioxidation layer, thereby forming a titanium silicide first preliminary layer from a region on a titanium layer side of said first silicon-containing region and a region on a first silicon-containing region side of said titanium layer, forming a titanium suicide second preliminary layer that is thicker than said titanium silicide first preliminary layer from a region on a titanium layer side of said second silicon-containing region and a region on a second silicon-containing region side of said titanium layer, and forming an ahoy layer including titanium and cobalt from a region on a cobalt layer side of said titanium layer and said remaining portion of said cobalt layer;

removing said antioxidation layer, and then removing said ahoy layer and a remaining portion of said titanium layer that remains on regions other than said first and second silicon-containing regions; and performing a second heat treatment on said titanium suicide first preliminary layer and said titanium suicide second preliminary layer at a higher temperature than in said first heat treatment so as to change said titanium suicide first preliminary layer and said titanium suicide second preliminary layer into a titanium suicide first layer and a titanium suicide second layer, said titanium layer having a thickness greater than a thickness of said cobalt layer, thicknesses of said titanium layer and said cobalt layer being selected so that all of said cobalt layer finishes reaction simultaneously with or before all of said titanium layer on said first silicon-containing region finishes reaction when said first heat treatment is performed, and said first heat treatment is performed until all of said titanium layer on said first silicon-containing region finishes reaction.

16. A method for simultaneously forming metal suicide layers according to claim 15, wherein said antioxidation layer is formed as a titanium nitride layer or a tungsten layer.

17. A method for simultaneously forming metal suicide layers according to claim 15, wherein said first heat treatment is performed at a temperature of at least 450° C. but lower than 750°, and said second heat treatment is performed at a temperature of at least 750° and no higher than 900°.

18. A method for simultaneously forming metal silicide layers according to claim 15, wherein said first silicon-containing region is provided as a diffusion layer in an active region of a silicon substrate, and said second silicon-containing region is provided as a gate electrode on an upper side of a top surface of the active region of said silicon substrate.

19. A method for simultaneously forming metal suicide layers according to claim 15, wherein said titanium layer has a thickness in a range of 10–50 nm and said cobalt layer has a thickness in a range of 5–30 nm.

20. A method for forming a metal suicide layer over a silicon-containing region, comprising:

forming a titanium layer by depositing titanium over a region containing said silicon-containing region;

forming a cobalt layer by depositing cobalt over said titanium layer;

forming an antioxidation layer over said cobalt layer;

performing a first heat treatment on the structure comprising said silicon-containing region, said titanium layer, said cobalt layer, and said antioxidation layer, thereby forming a titanium silicide preliminary layer from a region on a titanium layer side of said silicon-containing region and a region on a silicon-containing region side of said titanium layer, and forming an alloy layer including titanium and cobalt from said cobalt layer and a region on a cobalt layer side of said titanium layer;

removing said antioxidation layer, and then removing said alloy layer and a remaining portion of said titanium layer that remains on regions other than the region containing said silicon-containing region; and performing a second heat treatment on said titanium silicide preliminary layer at a higher temperature than in said first heat treatment so as to change said titanium silicide preliminary layer into a titanium silicide layer, said titanium layer having a thickness greater than a thickness of said cobalt layer, thicknesses of said titanium layer and said cobalt layer being selected so that all of said cobalt layer finishes reaction simultaneously with or before all of said titanium layer on said silicon-containing region finishes reaction when said first heat treatment is performed, and said first heat treatment is performed until all of said titanium layer on said silicon-containing region finishes reaction.

21. A method for forming a metal silicide layer according to claim 20, wherein said antioxidation layer is formed as a titanium nitride layer or a tungsten layer.

22. A method for forming a metal silicide layer according to claim 20, wherein said first heat treatment is performed at a temperature of at least 450° C. but lower than 750° C., and said second heat treatment is performed at a temperature of at least 750° C. and no higher than 900° C.

23. A method for forming a metal suicide layer according to claim 20, wherein said silicon-containing region is provided as a diffusion layer in an active region of a silicon substrate.

24. A method for forming a metal silicide layer according to claim 20, wherein said silicon-containing region is provided as a gate electrode on an upper side of a top surface of an active region of a silicon substrate.

25. A method for forming a metal silicide layer according to claim 20, wherein said silicon-containing region is provided as a metallization region on an upper side of a silicon substrate.

26. A method for forming a metal silicide layer according to claim 20, wherein said titanium layer has a thickness in a range of 10–50 nm and said cobalt layer has a thickness in a range of 5–30 nm.

27. A method for forming a metal silicide layer according to claim 20, wherein said first heat treatment is performed at a temperature of at least 600° C. but lower than 750° C.

* * * * *